US007894616B2

(12) United States Patent
Song et al.

(10) Patent No.: US 7,894,616 B2
(45) Date of Patent: Feb. 22, 2011

(54) CONDENSER MICROPHONE EMPLOYING WIDE BAND STOP FILTER AND HAVING IMPROVED RESISTANCE TO ELECTROSTATIC DISCHARGE

(75) Inventors: Chung Dam Song, Seoul (KR); Eek Joo Chung, Gimpo (KR); Hyun Ho Kim, Incheon (KR)

(73) Assignee: BSE Co., Ltd., Namdong-gu, Incheon (KR)

( * ) Notice: Subject to any disclaimer, the term of this patent is extended or adjusted under 35 U.S.C. 154(b) by 1076 days.

(21) Appl. No.: 10/550,170

(22) PCT Filed: Jun. 10, 2003

(86) PCT No.: PCT/KR03/01137

§ 371 (c)(1), (2), (4) Date: Jun. 9, 2006

(87) PCT Pub. No.: WO2004/084580

PCT Pub. Date: Sep. 30, 2004

(65) Prior Publication Data

US 2006/0256981 A1 Nov. 16, 2006

(30) Foreign Application Priority Data

Mar. 20, 2003 (KR) ...................... 10-2003-0017454

(51) Int. Cl.
*H04R 3/00* (2006.01)
*H04R 25/00* (2006.01)
*H03F 99/00* (2009.01)

(52) U.S. Cl. ......................... 381/113; 381/111; 381/92; 381/122; 381/312; 381/313; 381/121; 381/174

(58) Field of Classification Search ................. 381/113, 381/111, 121, 174, 312, 313, 92
See application file for complete search history.

(56) References Cited

U.S. PATENT DOCUMENTS 2,610,252 A * 9/1952 Fuller, Jr. ..................... 381/98
4,281,221 A 7/1981 DelBello
6,978,029 B1 * 12/2005 Ikeda ......................... 381/111

FOREIGN PATENT DOCUMENTS

JP 61-257100 11/1986
KR 20-0290284 9/2002

* cited by examiner

*Primary Examiner*—Devona E Faulk
(74) *Attorney, Agent, or Firm*—Ladas & Parry LLP

(57) ABSTRACT

A condenser microphone employs a wide band stop filter, having improved resistance to electrostatic discharge. This includes providing a condenser microphone used for a multi-band by comprising a wide band stop filter capable of efficiently blocking a wide band signal including low frequency and radio frequency used in a mobile communication. A condenser microphone includes: an acoustic module for converting sound pressure into an electric signal; an FET for amplifying the electric signal; and a wide band stop filter for blocking a wide band signal including low frequency and radio frequency output from the FET. The filter is realized by resistors and/or capacitors which are connected selectively according to the radio frequency band between the drain and the source of the FET. The range capable of removing EM noise is widened, an excellent filtering effect of noise is obtained, and resistance of electrostatic discharge applied from outside is improved.

20 Claims, 8 Drawing Sheets

CONDENSER MICROPHONE EMPLOYING WIDE BAND STOP FILTER AND HAVING IMPROVED RESISTANCE TO ELECTROSTATIC DISCHARGE

FIELD OF THE INVENTION

The present invention relates to a condenser microphone, and more particularly to a condenser microphone capable of not only suppressing electromagnetic (EM) noise but also improving resistance to electrostatic discharge (ESD) applied from outside.

BACKGROUND ART

In general, microphones are classified as follows, according to methods converting mechanical vibration into an electrical signal: carbon microphones using electrical resistance characteristics of carbon particles; crystal microphones using the piezoelectric effect of Rochelle Salt; moving coil microphones generating induced current by vibrating a diaphragm, in which a coil of wire is attached, in a magnetic field; velocity microphones using induced current generated when a metal film installed in a magnetic field receives sound waves and is vibrated; and condenser microphones using capacitance varied according to vibration of a diaphragm caused by sound waves.

Herein, the condenser microphone is universally used as a small microphone, but has a problem in that a DC power supply is necessarily required to apply a voltage to a condenser. Lately, to solve such a problem, an electret condenser microphone using an electret; which has a semi-permanent charge, is used, and has advantages in that a structure of a pre-amplifier is simplified by not needing a bias power supply and also its performance can be improved at a lower cost.

Meanwhile, a transmission section of a mobile terminal radiates a radio frequency signal of a large instantaneous power, which is in the range of a few mW to a few W, through an antenna. The radio frequency signal is induced into a line between a microphone and an external sound pressure signal process circuit and then is applied to a junction field-effect transistor (hereinafter, referred to as "JFET"), which is a field-effect transistor (hereinafter, referred to as "FET"), installed in the inside or outside of the microphone.

At this time, if a power of the radio frequency signal applied to the JFET is greater than a predetermined level, the JFET is nonlinearly operated, so as to generate a noise component relative to a peak envelope together with a harmonic wave. Since the frequency band of the peak envelope overlaps with a sound pressure signal of audio frequency in general, the signal of the noise component is amplified with the sound pressure signal and is inputted to the sound pressure signal process circuit, thereby forming the largest component of noise in the microphone.

Therefore, in order to remove such a noise, a microphone used in a mobile terminal, in the case of a single mode, comprises a notch filter using a LC resonator realized by one chip capacitor in the inside, so that radio frequency signals of a predetermined frequency range are blocked.

Meanwhile, a conventional microphone 1 used in a dual-mode mobile terminal, as shown in FIG. 1, comprises a filter 14 generating resonance at two frequency bands in using two chip capacitors C1 and C2. That is, terminals for mobile communications, which are widely used today, can be classified into Mobile Subscriber Radio Telephones of 900 MHz band and Personal Communication Systems (PCNs) of 1800 MHz band. Therefore, the dual-mode terminal must have a function capable of blocking radio frequency signals of both 900 MHz band and 1800 MHz band.

Referring to FIG. 1, an acoustic module is equivalently represented as a variable capacitor $C_{ECM}$ and is connected to the gate G of a FET 12 realized by a JFET. A filter 14 realized by a first and a second capacitor C1 and C2 is connected in parallel between the drain D and the source S of the FET 12. Herein, the first capacitor C1 has a capacitance of about 10 pF and functions to remove 1800 MHz frequency components, and the second capacitor C2 has a capacitance of about 33 pF and functions to remove 900 MHz frequency components.

In the case of using such a microphone in a mobile terminal, the output of the FET 12 is transmitted to a sound pressure signal process circuit 16 after passing the filter 14 designed with parallel connected capacitors C1 and C2, and the output of the sound pressure signal process circuit 16 passes a radio-frequency/intermediate-frequency circuit (RF/IF circuit) 18 and is radiated to the air through an antenna. Herein, the parallel connected capacitors C1 and C2 are designed with a chip capacitor C1 and C2, and each of the capacitors C1 and C2 forms an LC resonance circuit together with respective parasitic inductance L existing on the inside, thereby functioning as a notch filter.

FIG. 2 is a graph showing transfer characteristic of each filter in several cases in which the filter shown in FIG. 1 is realized by one capacitor or two capacitors.

In the graph shown in FIG. 2, the horizontal axis represents frequencies in GHz, the vertical axis represents attenuation levels. A dotted line g1 represents a transfer characteristic in a case of having only the second capacitor C2 of 33 pF and shows a rapid attenuation of a signal at about 900 MHz band, and a solid line g2 represents a transfer characteristic in a case of having only the first capacitor C1 of 10 pF and shows a rapid attenuation of a signal at about 1800 MHz band. Also, a dashed-dot line g3 represents a transfer characteristic in a case of having the first and the second capacitor C1 and C2 connected parallel with each other, and shows a great attenuation of a signal at about 900 MHz band and about 2.2 GHz.

However, such a conventional multi-band low-noise microphone has a problem in that only a little variation of the distance between two capacitors affects the resonance filter's center of 1800 MHz to be moved. Another problem is that it is impossible to effectively remove or block noise in a super-radio frequency mode. That is, in a case of using a new mode such as a new frequency band for IMT-2000 service (for example, 2000 MHz band or 2400 MHz band), since having a narrowband blocking characteristic limited within a predetermined frequency band, a conventional circuit can attenuate only electromagnetic noise within a predetermined frequency band but cannot attenuate radio frequency (RF) noise and electromagnetic noise generated within other frequency bands with the exception of a predetermined frequency band. Such a problem is also generated in a mode below an 1800 MHz frequency band.

Further, in order to improve reliability of a mobile terminal, each element of the terminal is required to have a strong resistance to electrostatic discharge. However, the conventional microphone is problematic in that the conventional microphone is easily affected by electrostatic discharge applied from outside. In other words, the mobile terminal must have no damaged internal circuit element at all, either after it experiences electrostatic discharge in the air with a voltage of 15 kV applied thereto in a state where its microphone is grounded, or after it experiences electrostatic discharge with a voltage of 8 kV applied thereto in a state where it is in direct contact with a node for the electrostatic discharge. However, the conventional microphones cannot satisfy the above-mentioned requirement with respect to the ESD applied from outside.

SUMMARY OF THE INVENTION

Therefore, the present invention has been made in view of the above-mentioned problems, and it is an object of the present invention to provide a condenser microphone comprising a wide band stop filter capable of efficiently blocking a wide band signal including low frequency and radio frequency used in a mobile communication, thereby being able to be used for a multi-band.

Another object of the present invention is to provide a condenser microphone having widened removal range of electromagnetic noise, improved blocking level of filtering, and improved resistance to electrostatic discharge applied from outside.

According to an aspect of the present invention, there is provided a condenser microphone decreasing noise by blocking radio frequency interference for a mobile terminal, comprising: an acoustic module for converting sound pressure into variation of an electric signal; an amplification means for amplifying the electric signal inputted from the acoustic module; and an EM-noise-filtering/ESD-blocking section for blocking a wide band signal including low frequency and radio frequency outputted from the amplification means and for blocking electromagnetic-wave/radio-frequency noises and electrostatic discharge entered from outside.

The amplification means is an FET, and the EM-noise-filtering/ESD-blocking section includes capacitors and resistors connected selectively between the gate G and the source S of the FET and/or between the drain D and the source S of the FET according to frequency band.

In addition, the capacitor can be changed in a range of 1 pF to 100 μF according to frequency band, and the resistor can be changed in a range of 10Ω to 1 GΩ according to frequency band. The resistor can be replaced by a magnetic induction element such as an inductor, and also the value of the resistors connected serially or parallel can be changed selectively according to frequency band. These will be identically applied to each embodiment in the following description.

BRIEF DESCRIPTION OF THE DRAWINGS

The foregoing and other objects, features and advantages of the present invention will become more apparent from the following detailed description when taken in conjunction with the accompanying drawings in which.

DESCRIPTION OF THE PREFERRED EMBODIMENTS

Reference will now be made in detail to the preferred embodiments of the present invention.

First, a condenser microphone according to the present invention comprises: an acoustic module having a capacitance varying according to an acoustic signal inputted thereto; a FET for converting and amplifying varied capacitance of the acoustic module into an electric signal; and an EM-noise-filtering/ESD-blocking section, which is connected to the output ports of the FET, for removing electromagnetic noise (EM noise) and for providing a function to block electrostatic discharge. For easy comprehension, according to the numbers of resistors and capacitors realizing the EM-noise-filtering/ESD-blocking section, embodiments will be classified and described as follows.

Embodiment 1

Figure 1:
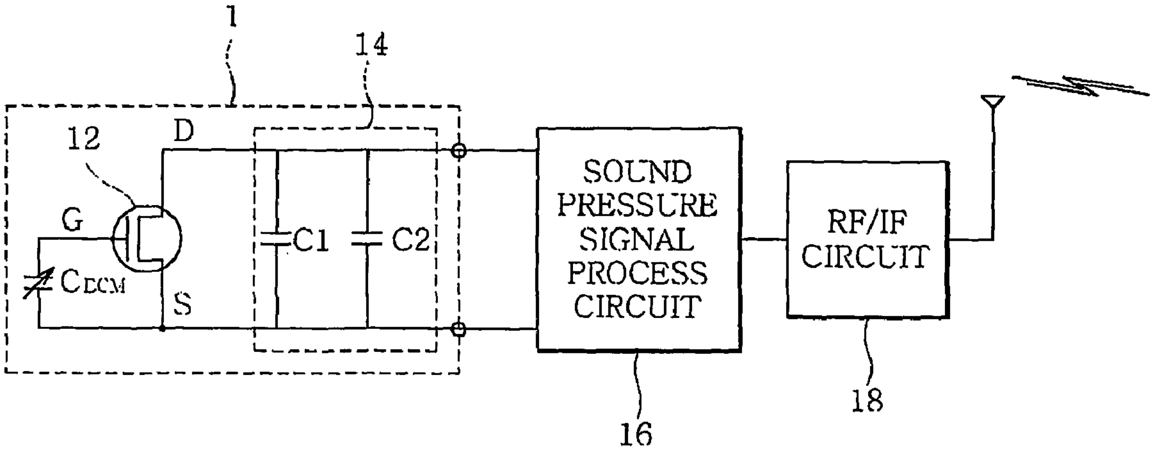
FIG. 1 is a schematic view of a multi-band low-noise microphone, having a capacitor array, used in a conventional mobile terminal.
Figure 2:
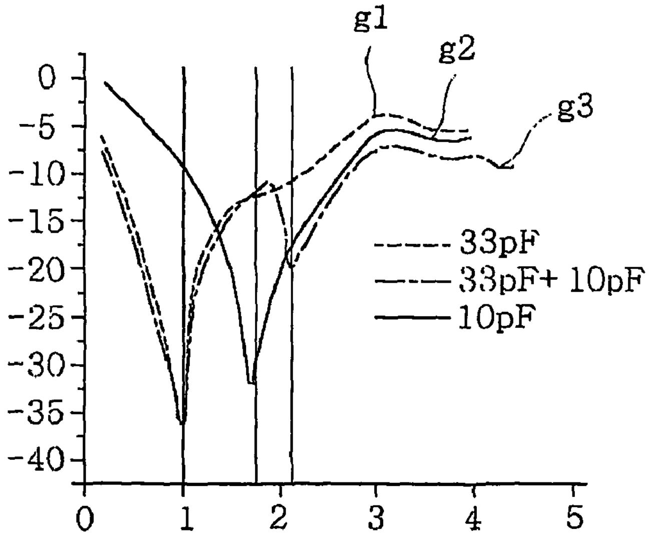
FIG. 2 is a graph showing transfer characteristics of each filter in several cases in which capacitance of the filter shown in FIG. 1 is changed variously.
Figure 3:
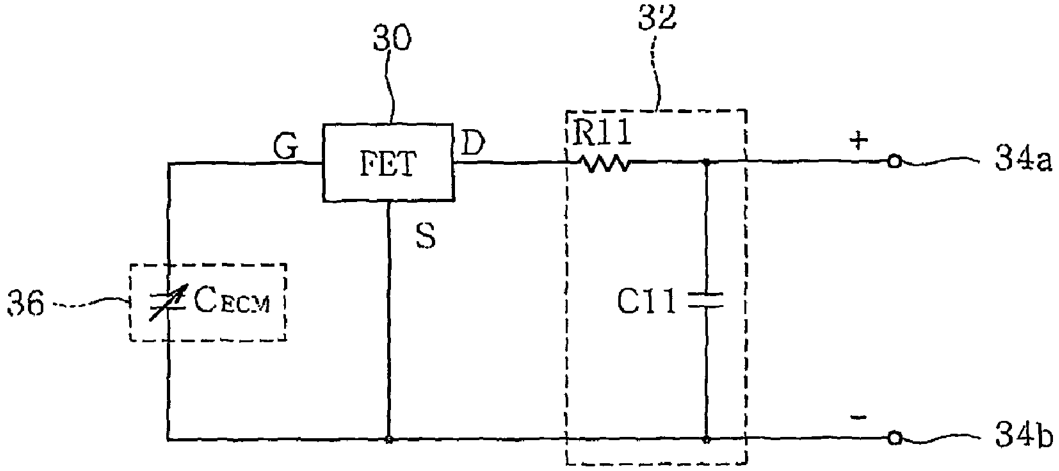
FIG. 3 is a circuit showing a microphone having an EM-noise-filtering/ESD-blocking section realized by one capacitor and one resistor according to a first embodiment of the present invention.

FIG. 3 is a circuit showing a microphone having an EM-noise-filtering/ESD-blocking section realized by one capacitor C11 and one resistor R11 according to the present invention.

Referring to FIG. 3, an acoustic module 36, which has a capacitance varying according to an acoustic signal input thereto, is equivalently represented as a variable capacitor $C_{ECM}$ and is connected to the gate G of a FET 30. Also, an EM-noise-filtering/ESD-blocking section 32 for removing electromagnetic noise and blocking electrostatic discharge is connected in parallel between the source S and the drain D of the FET 30. According to a first embodiment, the EM-noise-filtering/ESD-blocking section 32 consists of a resistor R11 and a capacitor C11, in which the resistor R11 is connected serially to the drain D of the FET 30 in such a manner that one end of the resistor R11 is connected to the drain D of the FET 30, and the capacitor C11 is connected between the other end of the resistor R11 and source S of the FET 30.

With this construction, sound pressure of a user vibrates a diaphragm (not shown) to vary the capacitance of the variable capacitor $C_{ECM}$, and such capacitance variation induces voltage variation at the gate G of the FET 30.

The FET 30 includes a JFET, which has a gate G connected to the variable capacitor $C_{ECM}$, a source S connected to a common ground, and a drain D connected to the EM-noise-filtering/ESD-blocking section 32, or an amplifier of a built-in-gain microphone, thereby amplifying an input signal. Such FETs 30 have a very high input impedance and a very low output impedance, so that it functions as an impedance transformer matching impedance of the acoustic module and circuit part.

The output of the FET 30 is outputted to output ports 34*a* and 34*b* after passing the EM-noise-filtering/ESD-blocking section 32. Here, the EM-noise-filtering/ESD-blocking section 32 functions as a wide band stop filter blocking high-frequency radio signals or EM noise which enters through the output ports 34*a* and 34*b* for connecting the microphone to an external device, while functioning to block electrostatic discharge which is applied from outside. That is, high pressure of electrostatic discharge applied through the output ports 34*a* and 34*b* from outside is discharged to ground through the capacitor C11 of large capacitance, and the resistor R11 prevents the electrostatic discharge from being directly applied to the inside circuit section. To achieve such a result, the capacitor C11 must have a large capacitance, enough to store current caused by the high pressure of electrostatic discharge, that is, the capacitor C11 must be at least 1 nF.

With the first embodiment, it is possible that the capacitance of the capacitor C11 is changed selectively from 1 nF to 100 μF according to conditions. For example, the capacitor C11 may have a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF, and the resistor R11 may have a resistance selected from the group consisting of 100Ω, 220Ω, 330Ω, 430Ω, 620Ω, 680Ω, 820Ω and 1 KΩ.

In a condenser microphone having a circuit as constructed according to the first embodiment described above, electromagnetic noise over a wide frequency band including low frequency and radio frequency can be blocked. Further, a condenser microphone according to the first embodiment has an improved blocking capability (resistance) enough to stand against electrostatic discharge of even above 8KV applied from outside when the microphone is grounded and high pressure of electrostatic discharge is applied directly to the output ports.

Embodiment 2

FIGS. 4A to 4D are circuits each of which shows a microphone having one of various EM-noise-filtering/ESD-blocking sections 32 selectively including two capacitors C21 and C22 and one resistor R21 according to a second embodiment of the present invention The EM-noise-filtering/ESD-blocking section 32 according to the second embodiment forms a shape of a character 'Π' or a shape of a character 'inverted Π' by connecting a resistor R21 between two capacitors C21 and C22 faced to each other, in which a shape of a character 'inverted Π' means a shape formed by inverting top and bottom of a shape of a character 'Π'. Also, a noise-blocking resistor R22 for blocking electromagnetic noise inputted to the FET 30 is selectively added between the gate G of the FET 30 and the acoustic module 36.

Figure 4A:
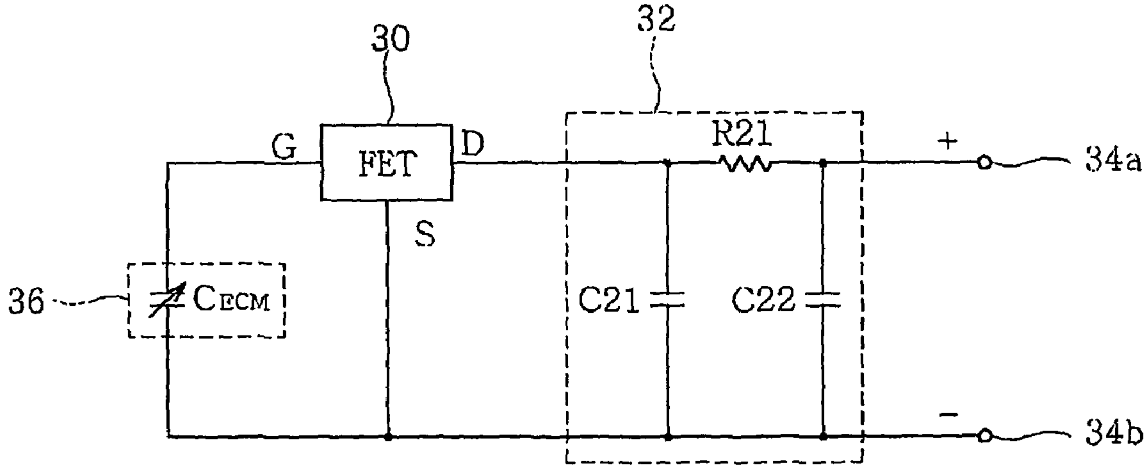
FIGS. 4A to 4D are circuits each of which shows a microphone having one of various EM-noise-filtering/ESD-blocking sections realized by two capacitors and one resistor according to a second embodiment of the present invention.
Figure 4B:
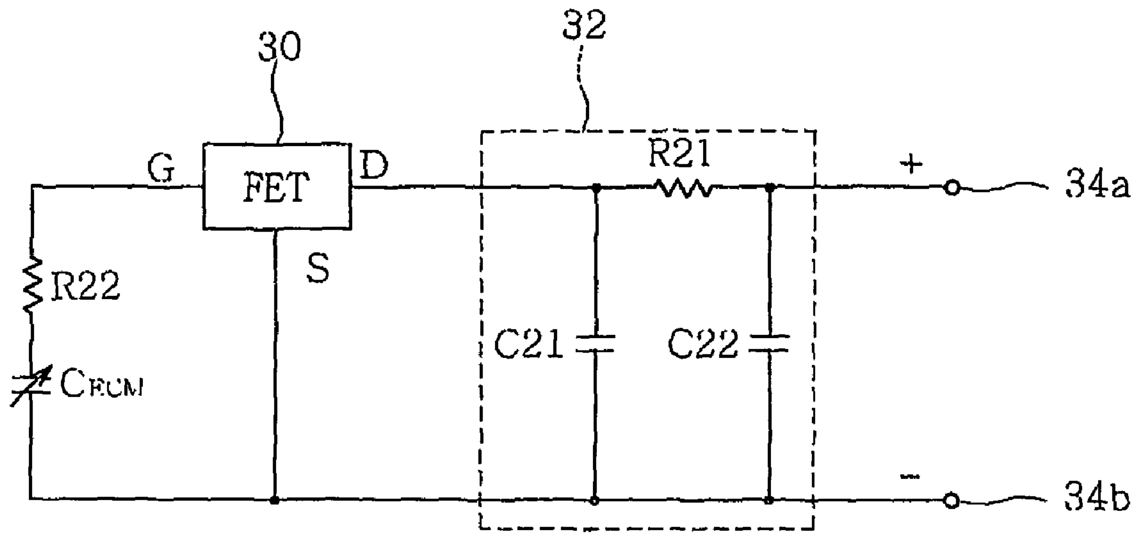

According to the second embodiment, FIG. 4A is a circuit showing a case in which the EM-noise-filtering/ESD-blocking section 32 has a shape of a character 'Π' and a noise-blocking resistor for preventing electromagnetic noise from being inputted to the FET 30 is not between the gate G of the FET 30 and the acoustic module 36. FIG. 4B is another circuit showing another case in which the EM-noise-filtering/ESD-blocking section 32 has a shape of a character 'Π' and a noise-blocking resistor R22 for blocking electromagnetic noise inputted to the FET 30 is connected between the gate G of the FET 30 and the acoustic module 36.

Referring to FIGS. 4A and 4B, a condenser microphone in accordance with the second embodiment of the present invention comprises: an acoustic module 36 having a capacitance varying according to an acoustic signal inputted thereto; an FET 30 for converting and amplifying varied capacitance of the acoustic module into an electric signal; and an EM-noise-filtering/ESD-blocking section 32, which is connected to the drain D of the FET 30, for removing electromagnetic noise (EM noise) and for providing a function to block electrostatic discharge.

The acoustic module 36 is equivalently represented as a variable capacitor $C_{ECM}$ and is connected to the gate G of the FET 30. Also, an EM-noise-filtering/ESD-blocking section 32 for removing electromagnetic noise and blocking electrostatic discharge is connected in parallel between the source S and the drain D of the FET 30.

The FET 30 includes a JFET, which has a gate G connected to the variable capacitor $C_{ECM}$, a source S connected to a common ground, and a drain D connected to the EM-noise-filtering/ESD-blocking section 32, or an amplifier of a built-in-gain microphone, thereby amplifying an input signal. Such FETs 30 have a very high input impedance and a very low output impedance, so that it functions as an impedance transformer matching impedance of the acoustic module and circuit part.

The EM-noise-filtering/ESD-blocking section 32 shown in FIGS. 4A and 4B according to the second embodiment is realized by a first capacitor C21 connected between the drain D and the source S of the FET 30, a second capacitor C22 connected parallel to the first capacitor C21, and a first resistor R21 connected serially to between an upper signal-line end of the first capacitor C21 and an upper signal-line end of the second capacitor C22, thereby forming a shape of a character 'Π'.

With this construction of such a second embodiment, the acoustic module 36 and the FET 30 are operated identically to those in the first embodiment, therefore a detailed description of the acoustic module 36 and the FET 30 will be omitted so as to avoid repeated description and the following description will be laid out centering around the EM-noise-filtering/ESD-blocking section 32 according to the second embodiment.

In the second embodiment, a filtering operation of the EM-noise-filtering/ESD-blocking section 32 is performed by the first capacitor C21 and the second capacitor C22, thereby blocking high-frequency noise or electromagnetic noise which is inputted from outside through the output ports 34*a* and 34*b*. Also, the first resistor R21 performs not only a decoupling function separating the first capacitor C21 and the second capacitor C22 but also an electrostatic-discharge blocking function preventing the electrostatic discharge from being directly applied to the inside circuit. The second capacitor C22 bypasses electrostatic discharge voltage applied through the output ports 34*a* and 34*b* to ground, thereby preventing the inside elements from being damaged by the electrostatic discharge. To achieve such a result, the second capacitor C22 must have a large capacitance, enough to store current caused by the high pressure of electrostatic discharge, that is, the second capacitor C22 must be at least 1 nF.

Meanwhile, in FIG. 4B, the second resistor R22 connected serially between the acoustic module 36 and the gate G of the FET is a noise-blocking resistor for preventing electromagnetic noise from being inputted to the FET 30.

With the second embodiment, it is possible that the capacitance of the first capacitor C21 and the second capacitor C22 are changed selectively between 10 pF and 100 μF according to conditions. For example, the first capacitor C21 may be 10 pF or 33 pF, while the second capacitor C22 may be a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF. Also, it is preferred that the first resistor R21 has a resistance selected from the group consisting of 100Ω, 220Ω, 330Ω, 430Ω, 620Ω, 680Ω, 820Ω and 1 KΩ, and it is preferred that the second resistor R22 has a resistance selected from the group consisting of 100Ω, 1 KΩ, 10 KΩ, 100 KΩ, and 1 MΩ.

In a condenser microphone having a circuit as constructed according to the second embodiment described above, electromagnetic noise over a wide frequency band including low frequency and radio frequency can be blocked. Further, a condenser microphone according to the first embodiment has an improved blocking capability (resistance) enough to stand against electrostatic discharge of even above 8KV applied from outside when the microphone is grounded and high pressure of electrostatic discharge is applied directly to the output ports.

Figure 4C:
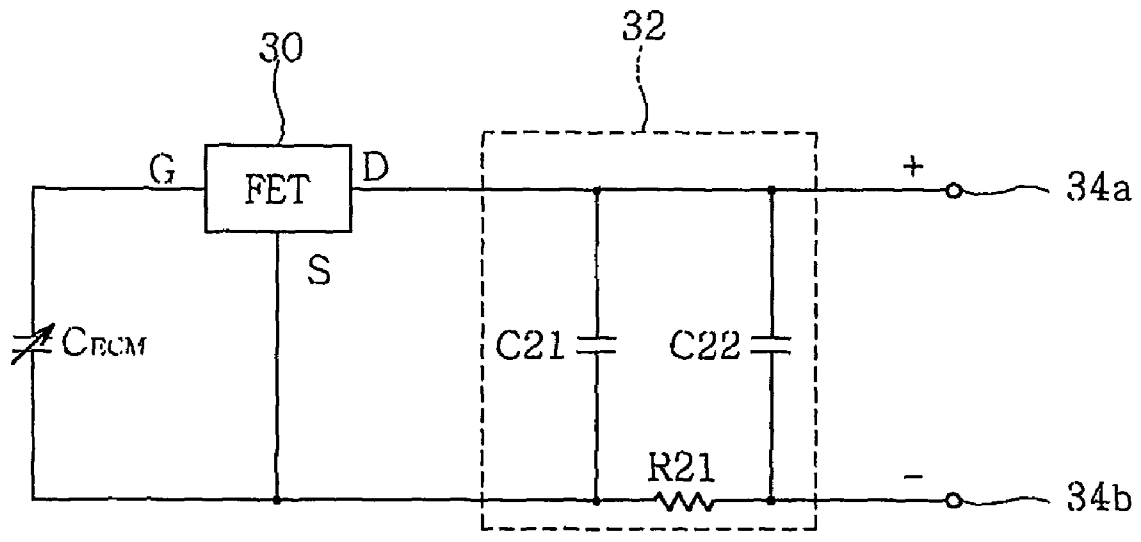
Figure 4D:
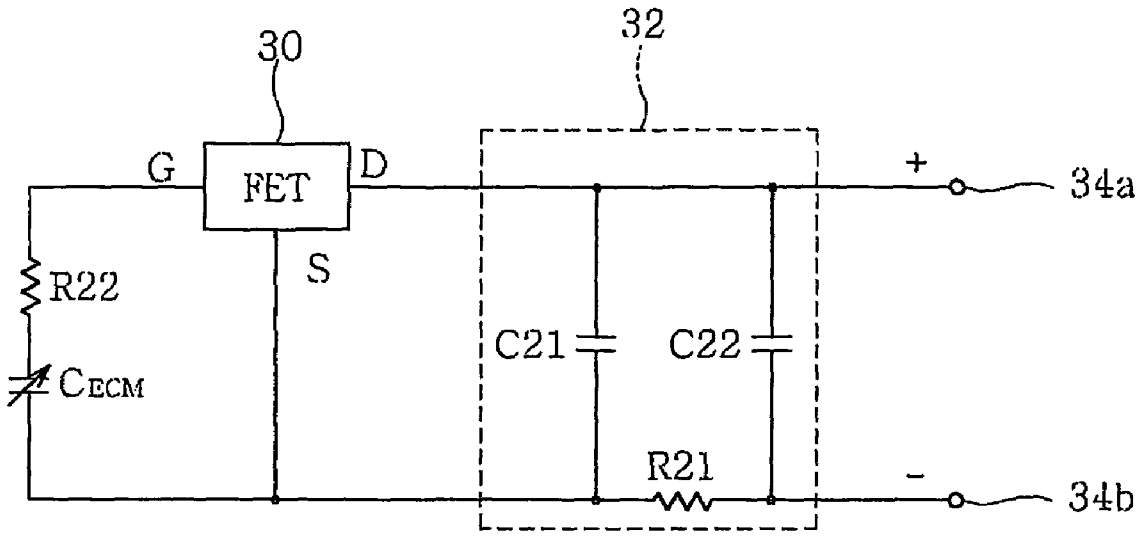

According to the second embodiment, FIG. 4C is still another circuit showing a case in which an EM-noise-filtering section 32 has a shape of a character 'inverted Π' and a noise-blocking resistor for preventing electromagnetic noise from being inputted to the FET 30 is not between the gate G of the FET 30 and the acoustic module 36. FIG. 4D is still another circuit showing another case in which the EM-noise-filtering section 32 has a shape of a character 'inverted Π' and a noise-blocking resistor R22 for preventing electromagnetic noise from being inputted to the FET 30 is connected between the gate G of the FET 30 and the acoustic module 36.

The EM-noise-filtering section 32 shown in FIGS. 4C and 4D according to the second embodiment comprises a first capacitor C21 connected between the drain D and the source S of the FET 30, a second capacitor C22 connected parallel to the first capacitor C21, and a first resistor R21 connected serially between a lower ground-line end of the first capacitor C21 and a lower ground-line end of the second capacitor C22, thereby forming a shape of a character 'inverted Π'.

With this construction of such a second embodiment, the acoustic module 36 and the FET 30 are operated identically to those in the first embodiment, therefore a detailed description of the acoustic module 36 and the FET 30 will be omitted so as to avoid repeated description and the following description will be laid out centering around the EM-noise-filtering section 32 according to the second embodiment.

In the second embodiment, a filtering operation of the EM-noise-filtering section 32 is performed by the first capacitor C21 and the second capacitor C22, thereby blocking high-frequency noise or electromagnetic noise which is input from outside through the output ports 34*a* and 34*b*. Also, the first resistor R21 performs a decoupling function separating the first capacitor C21 and the second capacitor C22. To achieve such a result, the second capacitor C22 must be realized by a wide band stop filter having a large capacitance efficiently capable of blocking a wide band signal including low frequency and radio frequency, that is, the second capacitor C22 must be at least 1 nF.

Meanwhile, in FIG. 4D, a second resistor R22 connected serially between the acoustic module 36 and the gate G of the FET is a noise-blocking resistor for preventing electromagnetic noise from being inputted to the FET 30.

With such second embodiments, it is possible that the capacitance of the first capacitor C21 and the second capacitor C22 are changed selectively from 10 pF to 100 μF according to conditions. For example, the first capacitor C21 may be 10 pF or 33 pF, while the second capacitor C22 may have a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF. Also, it is preferred that the first resistor R21 has a resistance selected from the group consisting of 100Ω, 220Ω, 330Ω, 430Ω, 620Ω, 680Ω, 820Ω and 1 KΩ, and it is preferred that the second resistor R22 has a resistance selected from the group consisting of 100Ω, 1 KΩ, 10 KΩ, 100 KΩ, and 1 MΩ.

In a condenser microphone having a circuit as constructed according to such second embodiment described above, electromagnetic noise over a wide frequency band including low frequency and radio frequency can be blocked.

In a circuit according to the second embodiments, an electric signal of the microphone inputted through the gate G of the FET 30 and the second resistor R22 is amplified in the FET 30 so as to have low noise, a radio frequency band of the electric signal is blocked so that the noise is removed, and then the electric signal is transmitted to a sound process circuit of a mobile terminal through the output ports 34*a* and 34*b*.

Figure 4E:
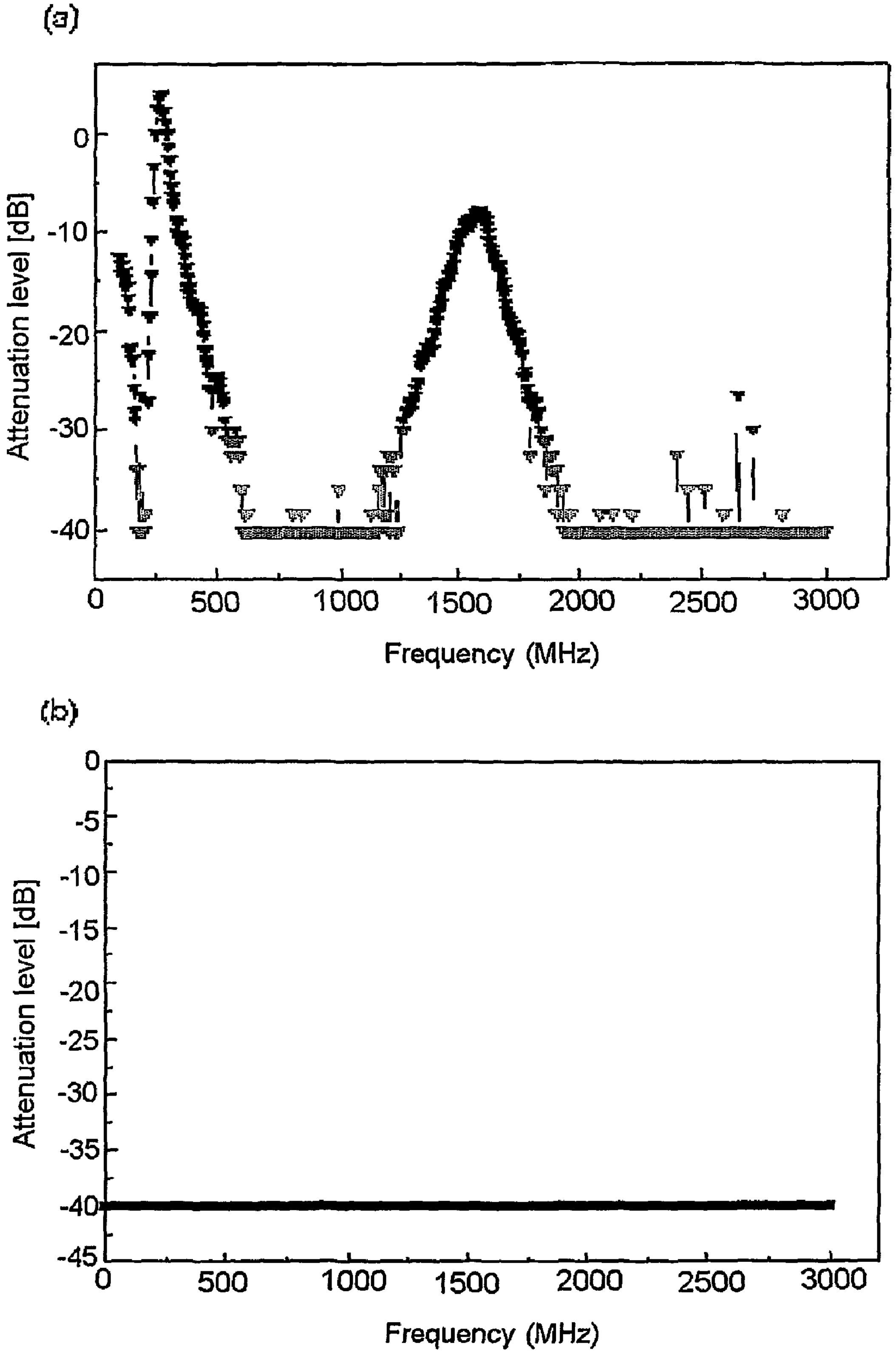
FIG. 4E is a graph for comparing noise characteristics of a condenser microphone according to the present invention with that of a conventional microphone in using direct RF injection.

FIG. 4E is a graph showing a result of comparing RF noise characteristics of a conventional commercially-used condenser microphone and a condenser microphone according to the second embodiment of the present invention.

Referring to FIG. 4E, (a) is a graph showing a filtering characteristic of a conventional microphone, and (b) is a graph showing a filtering characteristic of a microphone according to the second embodiment of the present invention. In the shown graphs, each horizontal axis represents frequency with a unit of MHz, and each vertical axis represents attenuation level with a unit of dB, in which a larger negative (−) value means a higher attenuation level.

In a direct RF injection method for a commercially-used condenser microphone in a frequency range from 0.125 MHz to 3.0 GHz, RF noise characteristic (a) of the microphone module shows an RF noise level attenuation of −40 dB generally at 900 MHz (GSM) and 1.8 MHz (DCS). However, the RF noise characteristic shows an RF noise level attenuation much smaller than −40 dB in other frequency ranges. A vertical axis expressed on a measuring apparatus used in the above test has a minimum value of −40 dB, thereby allowing all values lower than −40 dB to be expressed only as −40 dB.

On the other hand, in the case of applying a direct RF injection method to a condenser microphone according to the second embodiment of the present invention over frequency range from 0.125 MHz to 3.0 GHz, RF noise characteristic (b) of the microphone module shows an RF noise attenuation level of −40 dB, which is the minimum value of an available measurement range, over all of the frequency band. That is, the microphone according to the second embodiment shows a result that its RF noise level is improved to maximum 45 dB or more as compared to that of the commercially-used electret condenser microphone.

This shows that the condenser microphone according to the present invention functions as an excellent EMI filter.

Embodiment 3

Figure 5A:
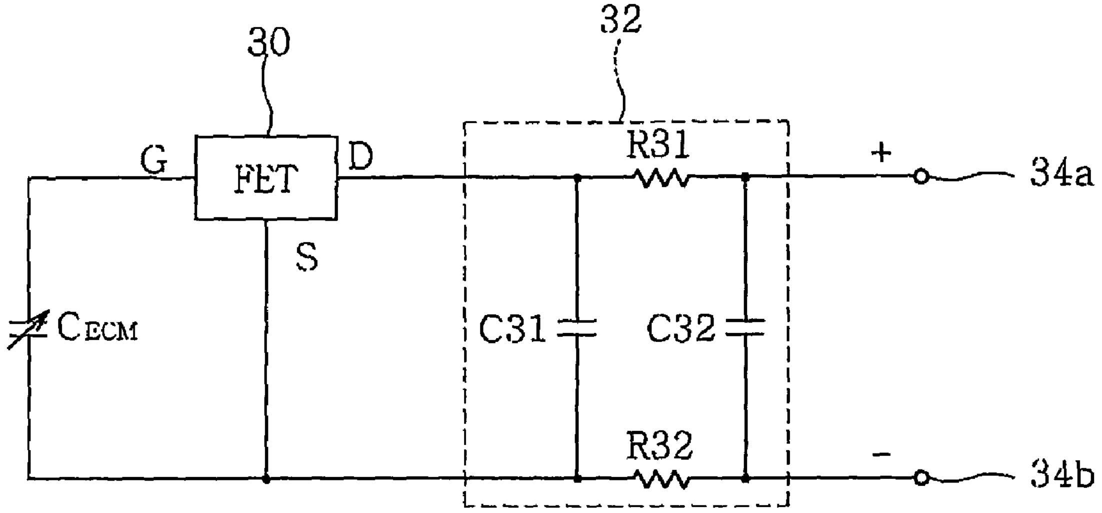
FIGS. 5A and 5B are circuits each of which shows a microphone having one of various EM-noise-filtering/ESD-blocking sections realized by two capacitors and two resistors according to a third embodiment of the present invention.
Figure 5B:
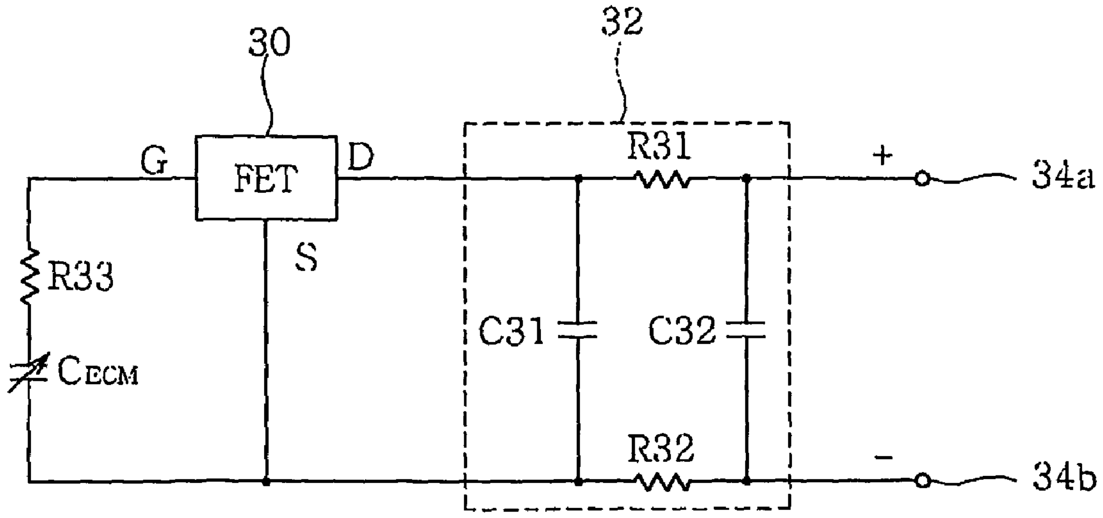

FIGS. 5A and 5B are circuits each of which shows a microphone having one of various EM-noise-filtering/ESD-blocking sections 32 including two capacitors C31 and C32 and two resistors R31 and R32 according to a third embodiment of the present invention. The EM-noise-filtering/ESD-blocking section 32 according to the third embodiment forms a shape of a character '#' with two capacitors C31 and C32 facing each other and two resistor R31 and R32 connected respectively between two adjacent ends of the capacitors C31 and C32. Also, a noise-blocking resistor R33 for preventing electromagnetic noise from being input to the FET is selectively added between the gate G of the FET 30 and the acoustic module 36.

As shown in FIGS. 5A and 5B, a condenser microphone according to the third embodiment of the present invention comprises an equivalent capacitor $C_{ECM}$ connected between the gate G and the source S of the FET 30 performing an amplification function, and also comprises an EM-noise-filtering/ESD-blocking section 32 connected between the drain D and the source S of the FET 30, in which the equivalent capacitor $C_{ECM}$ represents the capacitance of the microphone. In the case of FIG. 5B, a third resistor R3 is connected between the acoustic module 36 and the gate G of the FET 30. Also, the EM-noise-filtering/ESD-blocking section 32 according to the third embodiment forms a shape of a character '#' in such a manner that a first capacitor C31 and a second capacitor C32 are parallel connected to each other and a first resistor R31 and a second resistor R32 are connected respectively between ends of the capacitors C31 and C32.

Referring to FIGS. 5A and 5B, sound pressure of a user vibrates a diaphragm of a sound module (not shown), so as to vary the capacitance of the variable capacitor $C_{ECM}$, and such capacitance variation induces voltage variation at the gate G of the FET 30.

The FET 30 includes a JFET, which has a gate G connected to the variable capacitor $C_{ECM}$, a source S connected to a common ground, and a drain D connected to the EM-noise-filtering/ESD-blocking section 32, or an amplifier of a built-in-gain microphone, thereby amplifying an input signal. Such FETs 30 have a very high input impedance and a very low output impedance, so that it functions as an impedance transformer matching impedance of the acoustic module and circuit part.

The output of the FET 30 is output to output ports 34*a* and 34*b* after passing the EM-noise-filtering/ESD-blocking section 32. Here, the EM-noise-filtering/ESD-blocking section 32 functions as a wide band stop filter blocking high-frequency radio signals or EM noise which enters through the output ports 34*a* and 34*b* for connecting the microphone to an external device, while functioning to block electrostatic discharge which is applied from outside.

In the third embodiment, a filtering operation of the EM-noise-filtering/ESD-blocking section 32 is performed by the first capacitor C31 and the second capacitor C32, thereby blocking high-frequency noise or electromagnetic noise which is input from outside through the output ports 34*a* and 34*b*. Also, the first resistor R31 and the second resistor R32 performs not only a decoupling function separating the first capacitor C31 and the second capacitor C32 but also an electrostatic-discharge blocking function preventing the electrostatic discharge from being directly applied to the inside circuit. The second capacitor C32 bypasses electrostatic discharge voltage applied through the output ports 34*a* and 34*b* to ground, thereby preventing the inside elements from being damaged by the electrostatic discharge. To achieve such a result, the second capacitor C32 must have a large capacitance, enough to store current caused by the high pressure of electrostatic discharge, that is, the second capacitor C32 must be at least 1 nF.

Meanwhile, in FIG. 5B, the third resistor R33 connected serially between the acoustic module and the gate G of the FET 30 is a noise-blocking resistor for preventing electromagnetic noise from being inputted to the FET 30.

The capacitance of the first capacitor C31 and the second capacitor C32 can be changed selectively from 10 pF to 100 μF according to conditions. For example, the first capacitor C31 may be 10 pF or 33 pF, while the second capacitor C32 may have a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF. Also, it is preferred that each of the first resistor R31 and the second resistor R32 has a resistance selected from the group consisting of 100Ω, 220Ω, 330Ω, 430Ω, 620Ω, 680Ω, 820Ω and 1 KΩ, and it is preferred that the third resistor R33 has a resistance selected from the group consisting of 100Ω, 1 KΩ, 10 KΩ, 100 KΩ, and 1 MΩ.

In a condenser microphone having a circuit as constructed according to the third embodiment described above, electromagnetic noise over a wide frequency band including low frequency and radio frequency can be blocked. Further, a condenser microphone according to the first embodiment has an improved blocking capability (resistance) enough to stand against electrostatic discharge of even above 8KV applied from outside when the microphone is grounded and high pressure of electrostatic discharge is applied directly to the output ports.

Embodiment 4

Figure 6:
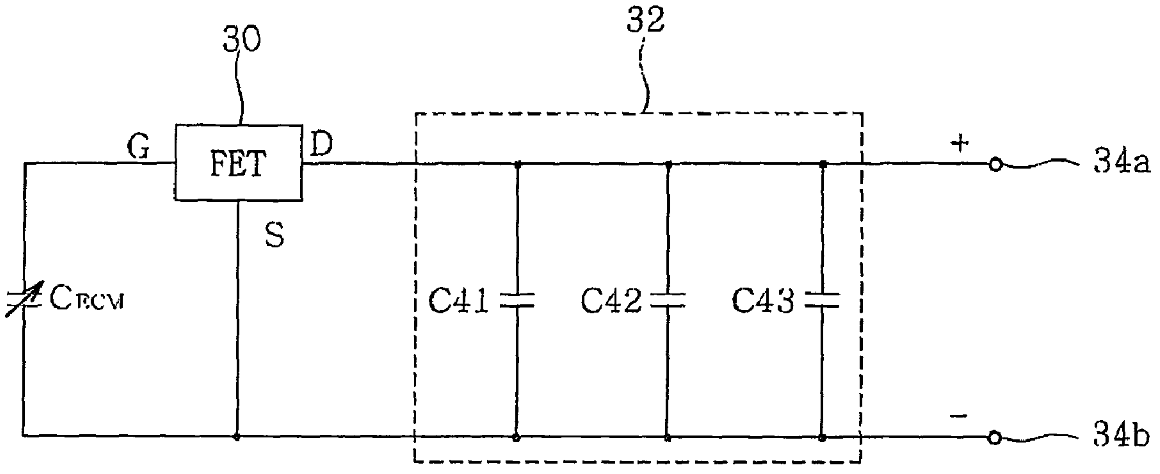
FIG. 6 is a circuit showing a microphone having an EM-noise-filtering/ESD-blocking section realized by only three capacitors according to a fourth embodiment of the present invention.

FIG. 6 is a circuit showing a microphone having an EM-noise-filtering section realized by only three capacitors C41 to C43 according to a fourth embodiment of the present invention.

Referring to FIG. 6, most of the construction is identical to that of the embodiments described above, therefore a detailed description will be omitted and the following description will be laid out centering around the EM-noise-filtering section 32, which has a different construction from the embodiments described above.

The EM-noise-filtering section 32 according to the fourth embodiment comprises a first capacitor C41, a second capacitor C42, and a third capacitor C43 connected in parallel between the drain D and the source S of the FET 30.

In the fourth embodiment, a filtering operation of the EM-noise-filtering section 32 is performed by the first to third capacitors C41 to C43, thereby blocking high-frequency noise or electromagnetic noise which is input from outside through the output ports 34*a* and 34*b*. To achieve such a result, the third capacitor C43 must be realized by a wide band stop filter having a large capacitance efficiently capable of blocking a wide band signal including low frequency and radio frequency, that is, the third capacitor C43 must be at least 1 nF.

The capacitance of the capacitors C41 to C43 can be changed selectively from 10 pF to 100 μF according to conditions. Preferably, the first capacitor C41 is selected to have a capacitance between 10 pF and 20 pF according to conditions, the second capacitor C42 is selected to have a capacitance between 20 pF and 1 nF according to conditions, and the third capacitor C43 is selected to have a capacitance between 1 nF and 100 μF according to conditions. More preferably, the third capacitor C43 has a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF.

In a condenser microphone having a circuit as constructed according to the fourth embodiment described above, electromagnetic noise over a wide frequency band including low frequency and radio frequency can be blocked.

Embodiment 5

Figure 7A:
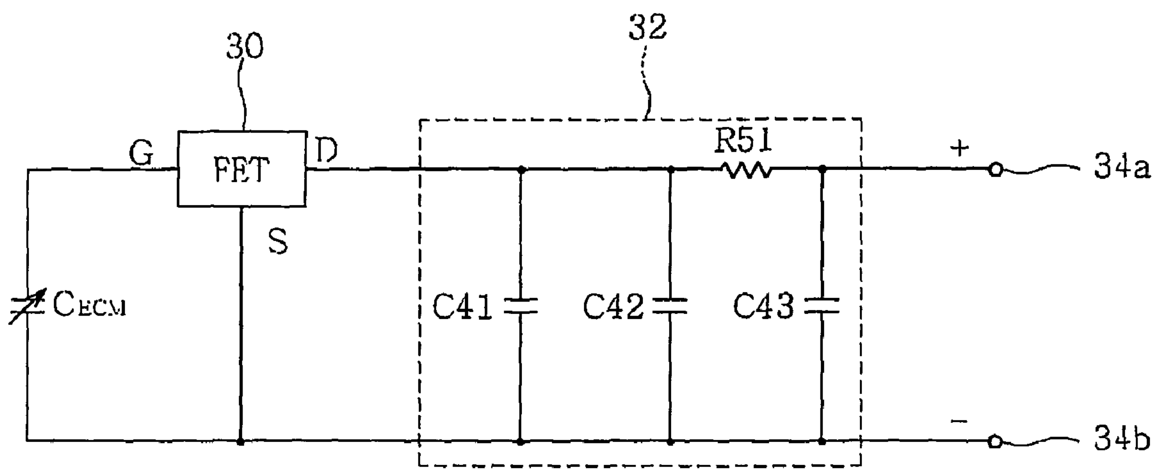
FIGS. 7A and 7B are circuits each of which shows a microphone having one of various EM-noise-filtering/ESD-blocking sections realized by three capacitors and one resistor according to a fifth embodiment of the present invention.
Figure 7B:
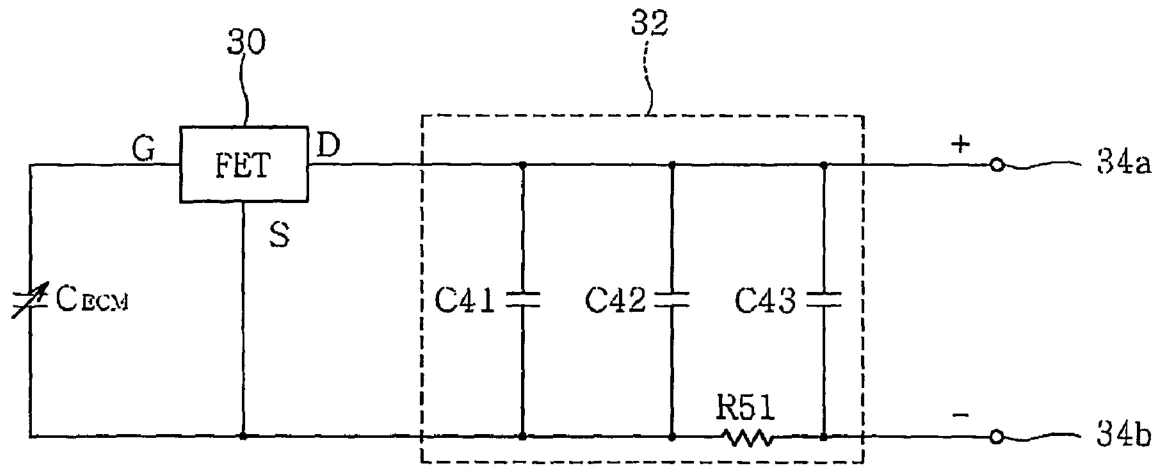

FIGS. 7A and 7B are circuits each of which shows a microphone having one of various EM-noise-filtering/ESD-blocking sections realized by three capacitors C41 to C43 and one resistor R51 according to a fifth embodiment of the present invention. FIG. 7A shows a construction in which the resistor R51 of the EM-noise-filtering/ESD-blocking section is connected serially to the drain D of the FET 30, and FIG. 7B shows a construction in which the resistor R51 of the EM-noise-filtering/ESD-blocking section is connected serially to the source S of the FET 30.

Referring to FIG. 7A, a condenser microphone according to the fifth embodiment of the present invention comprises an equivalent capacitor $C_{ECM}$ connected between the gate G and the source S of the FET 30 performing an amplification function. Also, the condenser microphone according to the fifth embodiment comprises a first capacitor C41, a second capacitor C42, and a third capacitor C43 connected in parallel between the source S and the drain D of the FET 30, and comprises a first resistor R51 connected between the drain connection ends of the second capacitor C42 and the third capacitor C43, so that an EM-noise-filtering/ESD-blocking section 32 is formed.

Also, referring to FIG. 7B, an EM-noise-filtering/ESD-blocking section 32 is realized in such a manner that a first capacitor C41, a second capacitor C42, and a third capacitor C43 are connected in parallel between the source S and the drain D of the FET 30, and a first resistor R51 is connected between the source connection ends of the second capacitor C42 and the third capacitor C43.

In the fifth embodiment of the present invention, repeated description of the construction and the operation identical to those of the embodiments described above will be omitted, and the following description will be laid out centering around the operation of the EM-noise-filtering section 32.

In the EM-noise-filtering/ESD-blocking section 32 shown in FIG. 7A according to the fifth embodiment of the present invention, the first to the third capacitors C41 to C43 perform a filtering function blocking high-frequency noise or electromagnetic noise which is input from outside through the output ports 34*a* and 34*b*, and the first resistor R51 performs not only a decoupling function separating the second capacitor C42 and the third capacitor C43 but also a blocking function preventing the electrostatic discharge voltage, which is applied from outside, from directly affecting the inside circuit Also, the third capacitor C43 bypasses electrostatic discharge voltage applied though the output ports 34*a* and 34*b* to ground, thereby preventing the inside elements from being damaged by the electrostatic discharge. To achieve such a result the third capacitor C43 must have a large capacitance, enough to store current caused by the high pressure of electrostatic discharge, that is, the third capacitor C43 must be at least 1 nF.

The capacitance of the capacitors C41 to C43 can be changed selectively from 10 pF to 100 μF according to conditions. Preferably, the first capacitor C41 is selected to have a capacitance between 10 pF and 20 pF according to conditions, the second capacitor C42 is selected to have a capacitance between 20 pF and 1 nF according to conditions, and the third capacitor C43 is selected to have a capacitance between 1 nF and 100 μF according to conditions. More preferably, the third capacitor C43 has a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF. Also, it is preferred that the first resistor R51 has a resistance selected from the group consisting of 100Ω, 220Ω, 330Ω, 430Ω, 620Ω, 680Ω, 820Ω and 1 KΩ.

In a condenser microphone having a circuit as constructed according to the fifth embodiment described above, electromagnetic noise over a wide frequency band including low frequency and radio frequency can be blocked. Further, a condenser microphone according to the first embodiment has an improved blocking capability (resistance) enough to stand against electrostatic discharge of even above 8KV applied from outside when the microphone is grounded and high pressure of electrostatic discharge is applied directly to the output ports.

In the EM-noise-filtering section 32 shown in FIG. 7B according to the fifth embodiment of the present invention, the first to the third capacitors C41 to C43 performs a filtering function blocking high-frequency noise or electromagnetic noise which is input from outside through the output ports 34*a* and 34*b*, and the first resistor R51 performs a decoupling function separating the second capacitor C42 and the third capacitor C43. To achieve such a result, the third capacitor C43 must be realized by a wide band stop filter having a large capacitance efficiently capable of blocking a wide band signal including low frequency and radio frequency, that is, the third capacitor C43 must be at least 1 nF.

The capacitance of the capacitors C41, C42, and C43 can be changed selectively from 10 pF to 100 μF according to conditions. Preferably, the first capacitor C41 is selected to have a capacitance between 10 pF and 20 pF according to conditions, the second capacitor C42 is selected to have a capacitance between 20 pF and 1 nF according to conditions, and the third capacitor C43 is selected to have a capacitance between 1 nF and 100 μF according to conditions. More preferably, the third capacitor C43 is selected to have a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF. Also, it is preferred that the first resistor R51 has a resistance selected from the group consisting of 100Ω, 220Ω, 330Ω, 430Ω, 620Ω, 680Ω, 820Ω and 1 KΩ.

In a condenser microphone having the circuit described above according to the fifth embodiment described above, electromagnetic noise over a wide frequency band including low frequency and radio frequency can be blocked.

Embodiment 6

Meanwhile, the first to the fifth embodiments described above can be applied to a variety of circuits for removing noise caused in a frequency band of 1.8 GHz or more including a next-generation mobile communication system (IMT2000). That is, a circuit for removing noise caused in the frequency band of 1.8 GHz or more has the same construction as the circuit described above for removing noise corresponding to the frequency band of 900 MHz and 1.8 GHz, and has only a different feature in that capacitors C1 and C2 for performing a filtering function are realized by capacitors having a capacitance between 1 pF and 100 μF. The capacitors having a capacitance between 1 pF and 100 μF can filter electromagnetic noise of 5KHz to 6 GHz.

For example, in a case of applying the EM-noise-filtering/ESD-blocking section 32 using three capacitors and one resistor as shown in FIG. 7A to a circuit for removing noise of 1.8 GHz or more, the first to the third capacitors C41, C42, and C43 for performing a filtering function can be selected to have a capacitance between 1 pF and 100 μF according to conditions. For example, the first capacitor C41 is selected to have a capacitance between 1 pF and 5 pF according to conditions, and preferably 4.7 pF, the second capacitor C42 is selected to have a capacitance between 5 pF and 1 nF according to conditions, and preferably 5.6 pF, the third capacitor C43 is selected to have a capacitance between 1 nF and 100 μF according to conditions, and preferably a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF, and it is preferred that the first resistor R51 has a resistance selected from the group consisting of 100Ω, 220Ω, 330Ω, 430Ω, 620Ω, 680Ω, 820Ω and 1 KΩ.

In the example described above, the capacitors C41, C42, and C43 and the resistor R51 form a wide band stop filter, while functioning to improve resistance to electrostatic discharge. High pressure of electrostatic discharge applied through the output ports from outside is discharged to ground port 34*b* through the third capacitor C43 having the largest capacitance, and the first resistor R51 prevents the electrostatic discharge from being applied directly to the inside circuit section. To achieve such a result, the third capacitor C43 must have a large capacitance, enough to store current caused by the high pressure of electrostatic discharge, that is, the third capacitor C43 must be at least 1 nF.

In a condenser microphone having a circuit as constructed according to the example described above, electromagnetic noise over a wide frequency band including low frequency and radio frequency can be reduced. Further, a condenser microphone according to the present invention has an improved resistance enough to stand against electrostatic discharge of even above 8KV applied from outside when the microphone is grounded and high pressure of electrostatic discharge is applied directly to the output ports.

In such a sixth embodiment, an electric signal of the microphone inputted through the gate G of the FET 30 is amplified in the FET 30 so as to have low noise, and is transmitted to a sound process circuit of a mobile terminal through the output ports 34*a* and 34*b* with noise removed by a wide band stop filter blocking signals of radio frequency band, in which the wide band stop filter is realized by the first capacitor C41, the second capacitor C42, the third capacitor C43, and the first resistor R51.

As can be seen from the foregoing, the condenser microphone according to the present invention has advantages of widening range capable of removing electromagnetic noise, obtaining an excellent filtering effect of electromagnetic noise with a circuit only including capacitors and resistors in a wide frequency band including low frequency and radio frequency, and largely improving blocking capability (resistance) to electrostatic discharge applied from outside.

While this invention has been described in connection with what is presently considered to be the most practical and preferred embodiment, it is to be understood that the invention is not limited to the disclosed embodiment and the drawings, but, on the contrary, it is intended to cover various modifications and variations within the spirit and scope of the appended claims.

What is claimed:

1. A condenser microphone employing a wide band stop filter for wideband signals of low frequency and radio frequency, the condenser microphone having improved resistance to electrostatic discharge applied from outside and preventing radio frequency interference to decrease noise, the condenser microphone comprising:

- an acoustic module for converting sound pressure into an electric signal;
- an amplification means for amplifying the electric signal input from the acoustic module; and
- an EM-noise-filtering/ESD-blocking section for blocking a wideband signal having low frequency and radio frequency output from the amplification means, blocking introduced electromagnetic waves, radio wave noise, and electrostatic discharge, the EM-noise-filtering/ESD-blocking section comprising:
  - a first bypass capacitor connected in parallel between an output port of the amplification means and ground port to function as a filter;
  - a second bypass capacitor connected parallel to the first bypass capacitor to perform an EM-noise-filtering and ESD-blocking function; and
  - a first decoupling resistor connected serially between an output port of the first bypass capacitor and an output port of the second bypass capacitor to perform a decoupling function, so that the EM-noise-filtering/ESD-blocking section has a shape of a character 'Π',
- wherein the first capacitor has a capacitance of 10 pF, the second capacitor has a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF, and the first resistor has a resistance selected from the group consisting of 220Ω, 330Ω, 430Ω, 620Ω, 680Ω, 820Ω and 1 KΩ, and
- wherein the first bypass capacitor bypasses a low frequency band and the second bypass capacitor bypasses a high frequency band.

2. A condenser microphone as claimed in claim 1, wherein the capacitor and the resistor have a capacitance between 1 pF and 100 μF and a resistance between 10Ω and 1 GΩ, respectively, each of which can be selectively adjusted according to frequency band.

3. A condenser microphone as claimed in claim 1, wherein the EM-noise-filtering/ESD-blocking section comprises:

- a resistor connected serially between output port of the amplification means and signal output port; and
- a capacitor connected between one end of the resistor and ground.

4. A condenser microphone as claimed in claim 3, wherein:

- the capacitor has a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF; and
- the resistor has a resistance selected from the group consisting of 100Ω, 220Ω, 330Ω, 430Ω, 620Ω, 680Ω, 820Ω and 1 KΩ.

5. A condenser microphone as claimed in claim 1, wherein the EM-noise-filtering/ESD-blocking section comprises:

- a first capacitor connected in parallel between an output port of the amplification means and a ground port to function as a filter;
- a second capacitor connected parallel to the first capacitor to perform an EM-noise-filtering function; and
- a first resistor connected serially to between a ground port of the first capacitor and a ground port of the second capacitor to perform a decoupling function, so that the EM-noise-filtering/ESD-blocking section has a shape of a character 'inverted Π'.

6. A condenser microphone as claimed in claim 5, wherein:

- the first capacitor has a capacitance of 10 pF or 33 pF;
- the second capacitor has a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF; and
- the first resistor has a resistance selected from the group consisting of 100Ω, 220Ω, 330Ω, 430Ω, 620Ω, 680Ω, 820Ω and 1 KΩ.

7. A condenser microphone as claimed in claim 1, wherein the EM-noise-filtering/ESD-blocking section comprises:

- a first and a second capacitor connected in parallel between output port of the amplification means and ground port; and
- a first and a second resistor connected respectively between adjacent ends of the two capacitors, so that the EM-noise-filtering/ESD-blocking section has a shape of a character '#', wherein, the first capacitor performs a filtering function, the second capacitor facing the first capacitor performs an EM-noise-filtering and electrostatic-discharge-blocking function, and the resistors performs a decoupling function and an electrostatic-discharge-blocking function.

8. A condenser microphone as claimed in claim 7, wherein:

the first capacitor has a capacitance of 10 pF or 33 pF;

the second capacitor has a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF; and each of the first and second resistors has a resistance selected from the group consisting of 100Ω, 220Ω, 330Ω, 430Ω, 620Ω, 680Ω, 820Ω and 1 KΩ.

9. A condenser microphone as claimed in claim 7, further comprising a noise-blocking resistor between the acoustic module and input port of the amplification means so as to block electromagnetic noise from being inputted.

10. A condenser microphone as claimed in claim 9, wherein the noise-blocking resistor has a resistance selected from the group consisting of 100Ω, 1 KΩ, 10 KΩ, 100 KΩ, and 1 MΩ.

11. A condenser microphone as claimed in claim 1, wherein the EM-noise-filtering section comprises a first capacitor, a second capacitor, and a third capacitor connected in parallel with each other between ground port and output port of the amplification means.

12. A condenser microphone as claimed in claim 11, wherein:

the first capacitor can be selectively adjusted so as to have a capacitance between 10 pF and 20 pF;

the second capacitor can be selectively adjusted so as to have a capacitance between 20 pF and 1 nF; and the third capacitor C43 can be selectively adjusted so as to have a capacitance between 1 nF and 100 μF.

13. A condenser microphone as claimed in claim 11, wherein, in the EM-noise-filtering/ESD-blocking section, a resistor is further connected serially between a signal output end of the second capacitor and a signal output end of the third capacitor.

14. A condenser microphone as claimed in claim 13, wherein:

the first capacitor is selectively adjusted so as to have a capacitance between 10 pF and 20 pF;

the second capacitor is selectively adjusted so as to have a capacitance between 20 pF and 1 nF;

the third capacitor has a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF; and the resistor has a resistance selected from the group consisting of 100Ω, 220Ω, 330Ω, 430Ω, 620Ω, 680Ω, 820Ω and 1 KΩ.

15. A condenser microphone as claimed in claim 11, wherein, in the EM-noise-filtering section, a resistor is further connected serially between a ground end of the second capacitor and a ground end of the third capacitor.

16. A condenser microphone as claimed in claim 15, wherein:

the first capacitor is selectively adjusted so as to have a capacitance between 10 pF and 20 pF;

the second capacitor is selectively adjusted so as to have a capacitance between 20 pF and 1 nF;

the third capacitor has a capacitance selected from the group consisting of 1 nF, 1.5 nF, 2.2 nF, 3.3 nF, 4.7 nF, 6.8 nF, 10 nF, 15 nF, 22 nF, 33 nF, 47 nF, 68 nF and 100 nF; and the resistor has a resistance selected from the group consisting of 100Ω, 220Ω, 330Ω, 430Ω, 620Ω, 680Ω, 820Ω and 1 KΩ.

17. A condenser microphone as claimed in claim 1, wherein, the capacitor is a temperature compensating capacitor or a capacitor of high dielectric constant.

18. A condenser microphone as claimed in claim 1, wherein, the amplification means is one of an amplifier used in a built-in-gain microphone and a field-effect transistor.

19. A condenser microphone as claimed in claim 5, further comprising a noise-blocking resistor between the acoustic module and input port of the amplification means so as to block electromagnetic noise from being inputted.

20. A condenser microphone as claimed in claim 19, wherein the noise-blocking resistor has a resistance selected from the group consisting of 100Ω, 1 KΩ, 10 KΩ, 100 KΩ, and 1 MΩ.

* * * * *